US012727144B2

(12) United States Patent
Zhang et al.

(10) Patent No.: US 12,727,144 B2
(45) Date of Patent: Sep. 1, 2026

(54) FORMING CONNECT STRUCTURES IN MEMORY SYSTEMS

(71) Applicant: Yangtze Memory Technologies Co., Ltd., Wuhan (CN)

(72) Inventors: Hao Zhang, Wuhan (CN); Fandong Liu, Wuhan (CN); Si Qiao, Wuhan (CN); Yanhong Wang, Wuhan (CN); Xiao Ding, Wuhan (CN); Wei Liu, Wuhan (CN); Wenyu Hua, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 313 days.

(21) Appl. No.: 18/518,197

(22) Filed: Nov. 22, 2023

(65) Prior Publication Data

US 2025/0107063 A1 Mar. 27, 2025

Related U.S. Application Data

(63) Continuation of application No. PCT/CN2023/120227, filed on Sep. 21, 2023.

(51) Int. Cl.
*H10B 12/00* (2023.01)

(52) U.S. Cl.
CPC ......... *H10B 12/0335* (2023.02); *H10B 12/31* (2023.02)

(58) Field of Classification Search
CPC ...... H10B 12/31; H10B 12/05; H10D 30/025; H10D 30/6728; H10D 30/6735; H10D 30/6757
See application file for complete search history.

(56) References Cited

U.S. PATENT DOCUMENTS

| | | | | |
|---|---|---|---|---|
| 10,431,587 | B2 | 10/2019 | Liu et al. | |
| 2012/0214285 | A1* | 8/2012 | Guha .................. | H10D 30/025 438/270 |
| 2022/0139918 | A1 | 5/2022 | Lee | |
| 2023/0255017 | A1 | 8/2023 | Kim et al. | |
| 2023/0292492 | A1 | 9/2023 | Kim | |

OTHER PUBLICATIONS

International Search Report in International Appln. No. PCT/CN2023/120227, mailed on Mar. 6, 2024, 4 pages.
Communication pursuant to Article 94(3) EPC in European Appln. No. 23797632.9, mailed on Jun. 12, 2026, 10 pages.

* cited by examiner

*Primary Examiner* — Fernando L Toledo
*Assistant Examiner* — Adam S Bowen
(74) *Attorney, Agent, or Firm* — Fish & Richardson P.C.

(57) ABSTRACT

Example three-dimensional (3D) memory devices, methods, and memory systems for connecting vertical transistors and capacitors using connect structures are disclosed. One example method includes forming a first structure that includes multiple vertical transistors. A connect layer is formed over the first structure. The connect layer is etched to form connect structures, where each of the connect structures is coupled to a corresponding one of the vertical transistors. Multiple capacitors are formed over the connect layer, where each of the plurality of capacitors is coupled to a respective connect structure.

20 Claims, 22 Drawing Sheets

504
408
406
404
506
502
408
406
404

FORMING CONNECT STRUCTURES IN MEMORY SYSTEMS

CROSS-REFERENCE TO RELATED APPLICATIONS

This application is s a continuation of International Application No. PCT/CN2023/120227, filed on Sep. 21, 2023, the disclosure of which is hereby incorporated by reference in its entirety.

TECHNICAL FIELD

The present disclosure relates to forming connect structures in three-dimensional (3D) memory devices and memory systems.

BACKGROUND

A memory system can include switch devices and storage units that are connected by connect structures. Vertical transistors can be used as the switch devices to simplify the layout of metal wiring the word lines and bit lines. A 3D memory device can include a memory array of memory cells and peripheral circuits for facilitating operations of the memory array. The memory cells can include vertical transistors.

SUMMARY

The present disclosure relates to three-dimensional (3D) memory devices, methods, and memory systems for connecting vertical transistors and capacitors using connect structures. One example method includes forming a first structure that includes multiple vertical transistors. A connect layer is formed over the first structure. The connect layer is etched to form connect structures, where each of the connect structures is coupled to a corresponding one of the vertical transistors. Multiple capacitors are formed over the connect layer, where each of the plurality of capacitors is coupled to a respective connect structure.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF DRAWINGS

Like reference numbers and designations in the various drawings indicate like elements.

DETAILED DESCRIPTION

This specification relates to 3D memory devices, methods, and memory systems for connecting vertical transistors and capacitors using connect structures. In some cases, forming connect structures between vertical transistors and capacitors can be challenging due to the size limitations associated with vertical transistors. To mitigate the impact of the size limitations associated with vertical transistors, a connect layer can be first formed over multiple vertical transistors, and then an etching process can be applied to the connect layers to form multiple connect structures, each connecting a vertical transistor and a respective capacitor. The connect layer can be formed by depositing multiple layers sequentially, each having a different material.

Implementations of the present disclosure can provide one or more of the following technical advantages and/or benefits. For example, polysilicon layer can be formed as part of the connect layer before the etching process to avoid inconsistency of polysilicon in individual connect structures. Silicide layer can also be formed as part of the connect layer before the etching process to avoid inconsistency of silicide in individual connect structures. Additionally, processing associated with interfaces between different components of the memory cells can be simplified.

In some implementations, vertical transistors can be used as the switch and selecting devices in a memory cell array of memory devices (e.g., DRAM, PCM, and ferroelectric DRAM (FRAM)). Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

In some implementations, the vertical transistors can include multi-gate transistors (e.g., gate-all-around (GAA) transistors, tri-gate transistors, or double-gate transistors), which can have a larger gate control area to achieve better channel control with a smaller subthreshold swing. During the off state, since the channel is fully depleted, the leakage current of multi-gate transistors can be significantly reduced as well. Thus, using multi-gate transistors instead of planar transistors can achieve enhanced speed (saturated drain current)/leakage current performance.

Figure 1A:
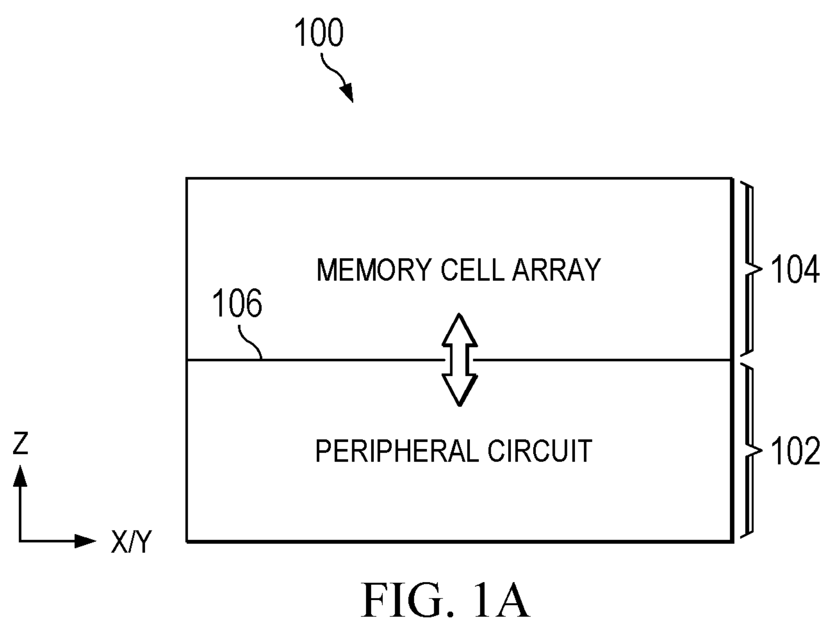
FIG. 1A illustrates a schematic view of a cross-section of a 3D memory device, according to some aspects of the present disclosure.

In some implementations, the vertical transistors can include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. Thus, the memory cell density in the bit line direction can be significantly increased (e.g., doubled) without unduly complicating the fabrication process compared with using processes, such as self-aligned double patterning (SADP). Also, the mirror-symmetric single-gate transistors have a larger process window for word line, bit line, and transistor pitch reduction, compared to either planar transistors or multi-gate vertical transistors, for example, with dual-side or all-around gates FIG. 1A illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including the peripheral circuits of a memory cell array. 3D memory device 100 can also include a second semiconductor structure 104 including the memory cell array. The peripheral circuits (e.g., control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a subcircuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, which can be implemented, for example, with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, 3D memory device 100 can also include second semiconductor structure 104 including an array of memory cells (memory cell array) that can use transistors as the switch and selecting devices. In some implementations, the memory cell array includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some implementations, each DRAM cell includes a capacitor for storing a bit of data as a positive or negative electrical charge as well as one or more transistors (e.g., pass transistors) that control (e.g., switch and select) access to it. In some implementations, each DRAM cell is a one-transistor, one-capacitor (1T1C) cell. Since transistors can leak a small amount of charge, the capacitors can slowly discharge, causing information stored in them to drain. As such, a DRAM cell can be refreshed to retain data, for example, by the peripheral circuit in first semiconductor structure 102, according to some implementations.

As shown in FIG. 1A, 3D memory device 100 further includes a bonding interface 106 vertically between (in the vertical direction, e.g., the z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
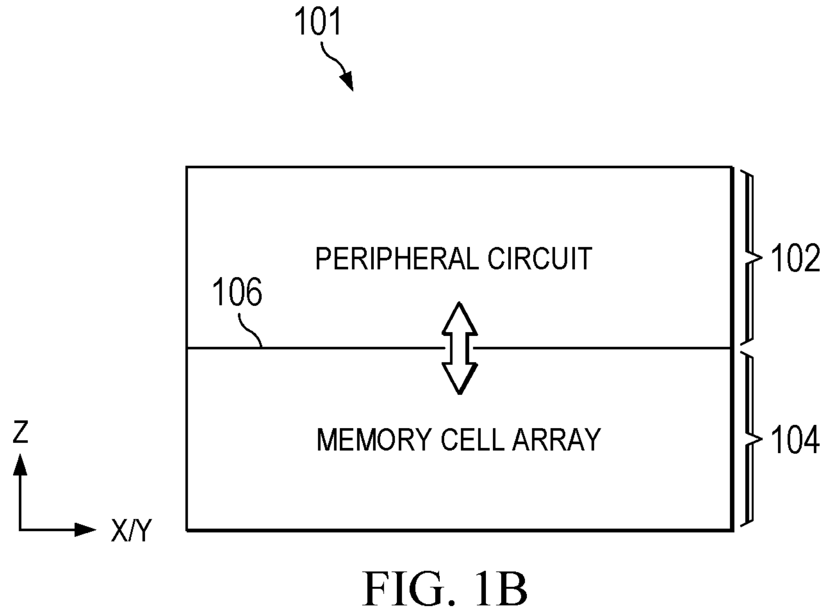
FIG. 1B illustrates a schematic view of a cross-section of another 3D memory device, according to some aspects of the present disclosure.

It is understood that the relative positions of stacked first and second semiconductor structures 102 and 104 are not limited. FIG. 1B illustrates a schematic view of a cross-section of another 3D memory device 101, some aspects of the present disclosure. Different from 3D memory device 100 in FIG. 1A in which second semiconductor structure 104 including the memory cell array is above first semiconductor structure 102 including the peripheral circuits, in 3D memory device 101 in FIG. 1B, first semiconductor structure 102 including the peripheral circuit is above second semiconductor structure 104 including the memory cell array. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

It is noted that x, y, and z axes are included in FIGS. 1A and 1B to further illustrate the spatial relationship of the components in 3D memory devices 100 and 101. The substrate of the 3D memory device includes two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing the spatial relationships is applied throughout the present disclosure.

Figure 2:
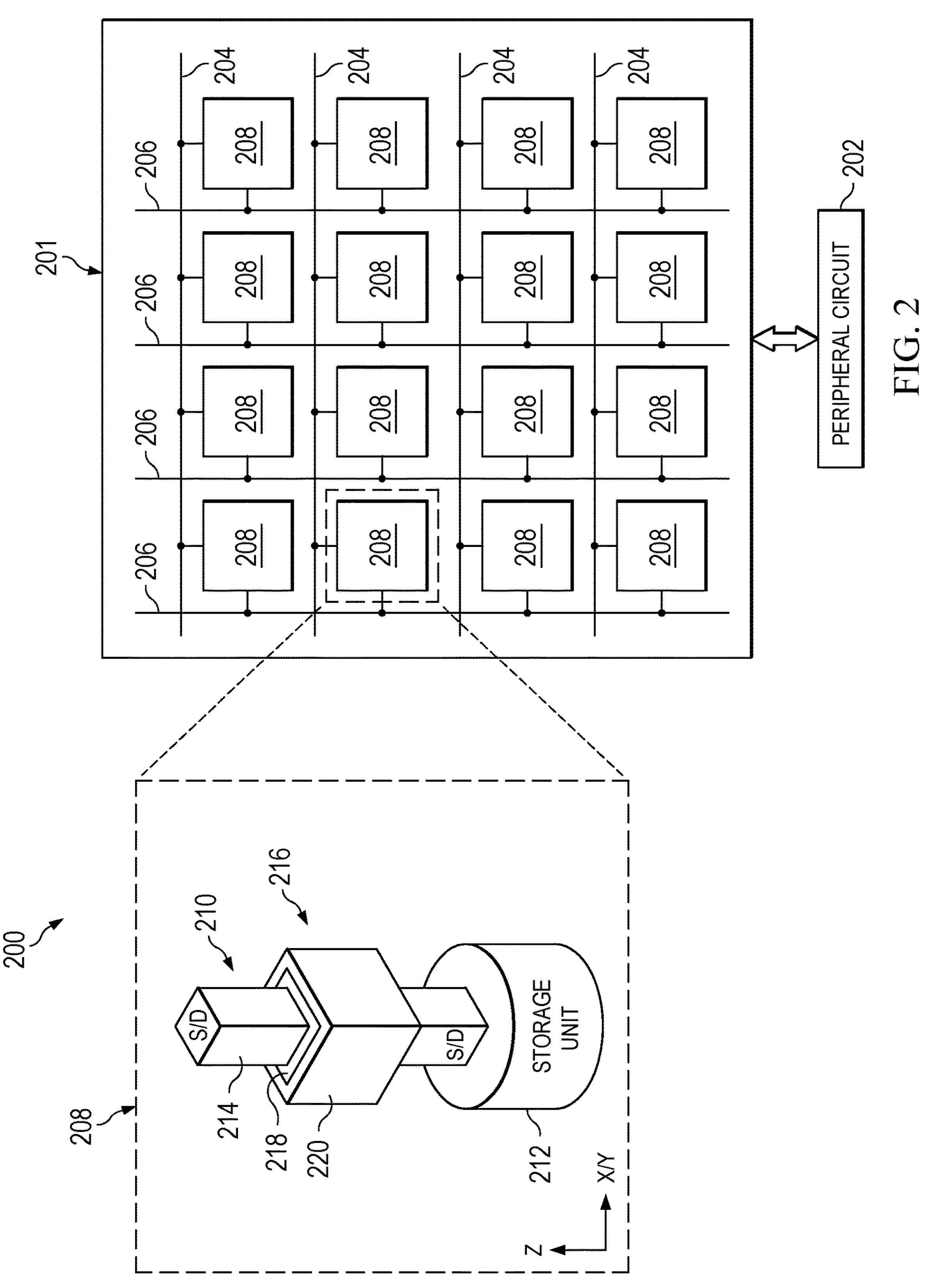
FIG. 2 illustrates a schematic diagram of a memory device 200 including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the z direction) above the substrate (not shown). That is, semiconductor body 214 can extend above the top surface of the substrate to expose not only the top surface of semiconductor body 214, but also one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the x-y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered to having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, i.e., in one or more planes of the side surface(s) of the active region. In other words, the active region of vertical transistor 210, i.e., semiconductor body 214, can be at least partially surrounded by gate structure 216. Gate structure 216 can include a gate dielectric 218 over one or more sides of semiconductor body 214, e.g., in contact with four side surfaces of semiconductor body 214 as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, i.e., gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, i.e., a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (SID, dope regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. During the off state, since the channel is fully depleted, the leakage current of vertical transistor 210 can be significantly reduced a well. The multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (i.e., a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 210, semiconductor body 214 extends vertically (in the z-direction), and the source and the drain are disposed in the different lateral planes, according to some implementations. In some implementations, the source and the drain are formed at two ends of semiconductor body 214 in the vertical direction (the z direction), respectively, thereby being overlapped in the plan view. As a result, the area (in the x-y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

Figure 3A:
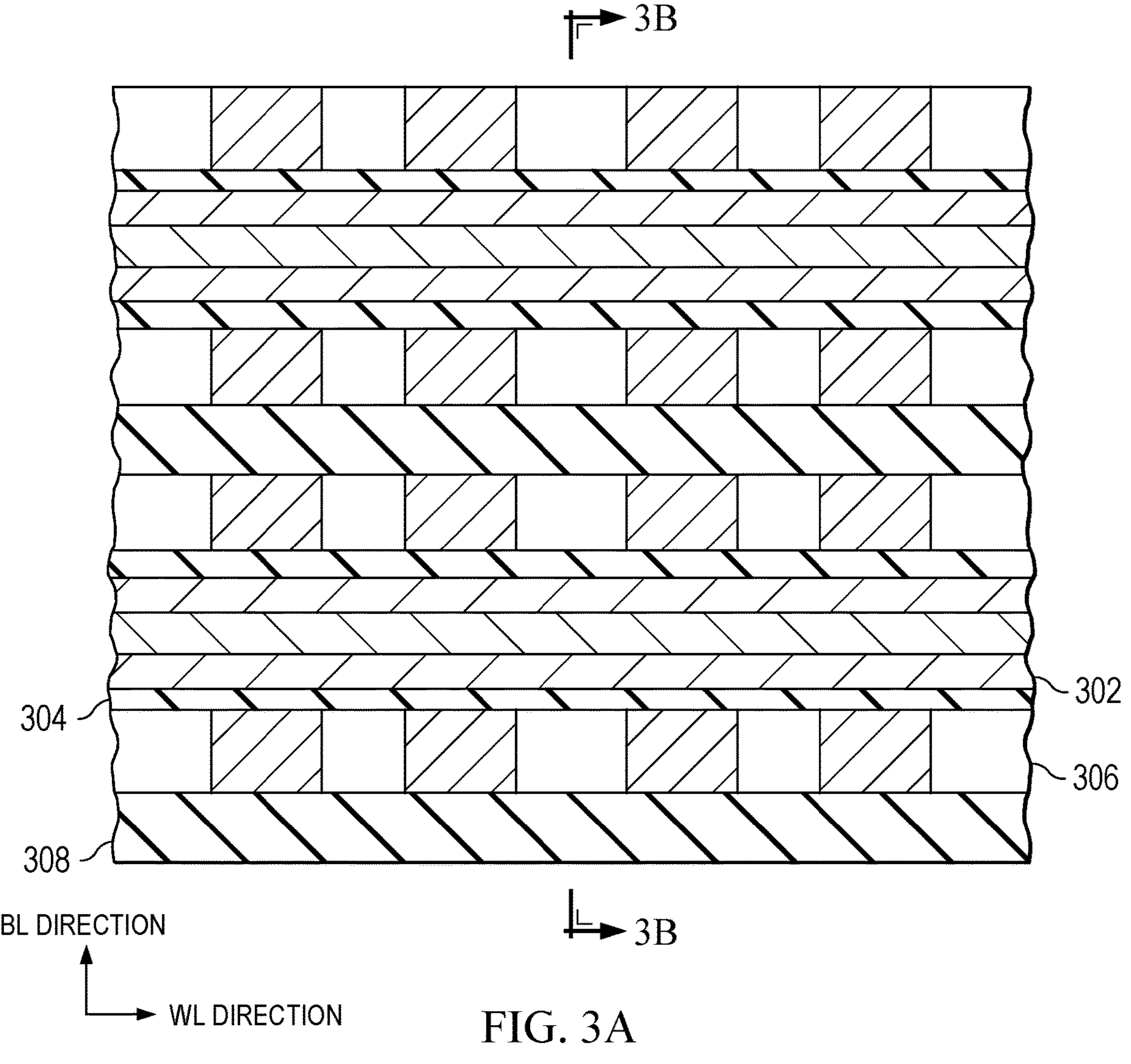
FIGS. 3A and 3B illustrate a plan view and a side view respectively of an array of memory cells each including a vertical transistor in a memory device, according to some aspects of the present disclosure.
Figure 3B:
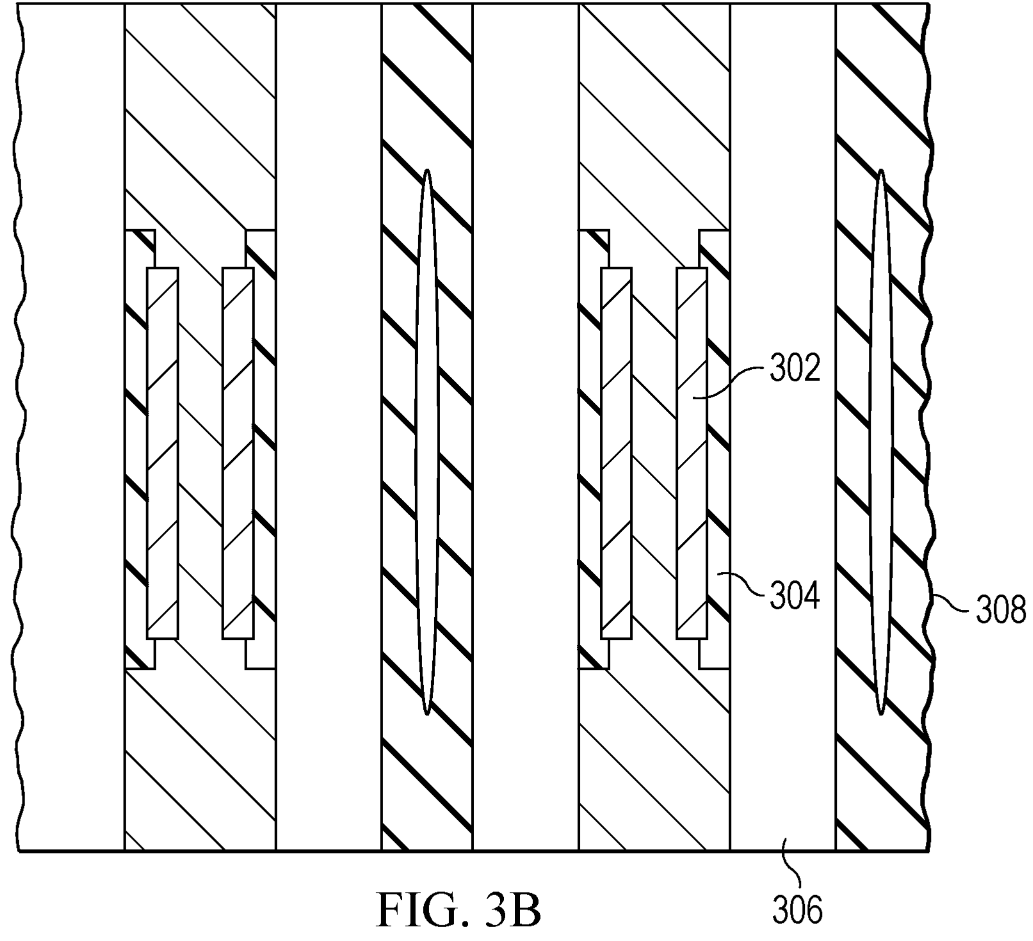

FIGS. 3A and 3B illustrate a plan view and a side view respectively of an array of memory cells each including a vertical transistor in a memory device, according to some aspects of the present disclosure. Each vertical transistor includes a gate electrode that can be part of word line 302, a gate dielectric 304, and a semiconductor body 306. Details of components of a vertical transistor are described in FIG. 2.

As shown in FIGS. 3A and 3B, two adjacent vertical transistors of memory cells in the bit line direction can be mirror-symmetric to one another, according to some implementations. Semiconductor bodies 306 of each pair of two adjacent vertical transistors of memory cells in the bit line direction can be formed by separating a semiconductor pillar into two pieces using a trench isolation 308 extending in the word line direction and in parallel with word lines 302. Trench isolations 308 and word lines 302 can be disposed in an interleaved manner in the bit line direction. In some implementations, trench isolation 308 can be formed in the middle of the semiconductor pillars (not shown) such that the resulting pair of semiconductor bodies 306 are mirror-symmetric to one another with respect to trench isolation 308, so are the pair of vertical transistors having semiconductor bodies 306 when the respective gate structures are mirror-symmetric to one another with respect to trench isolation 308 as well.

Figure 4A:
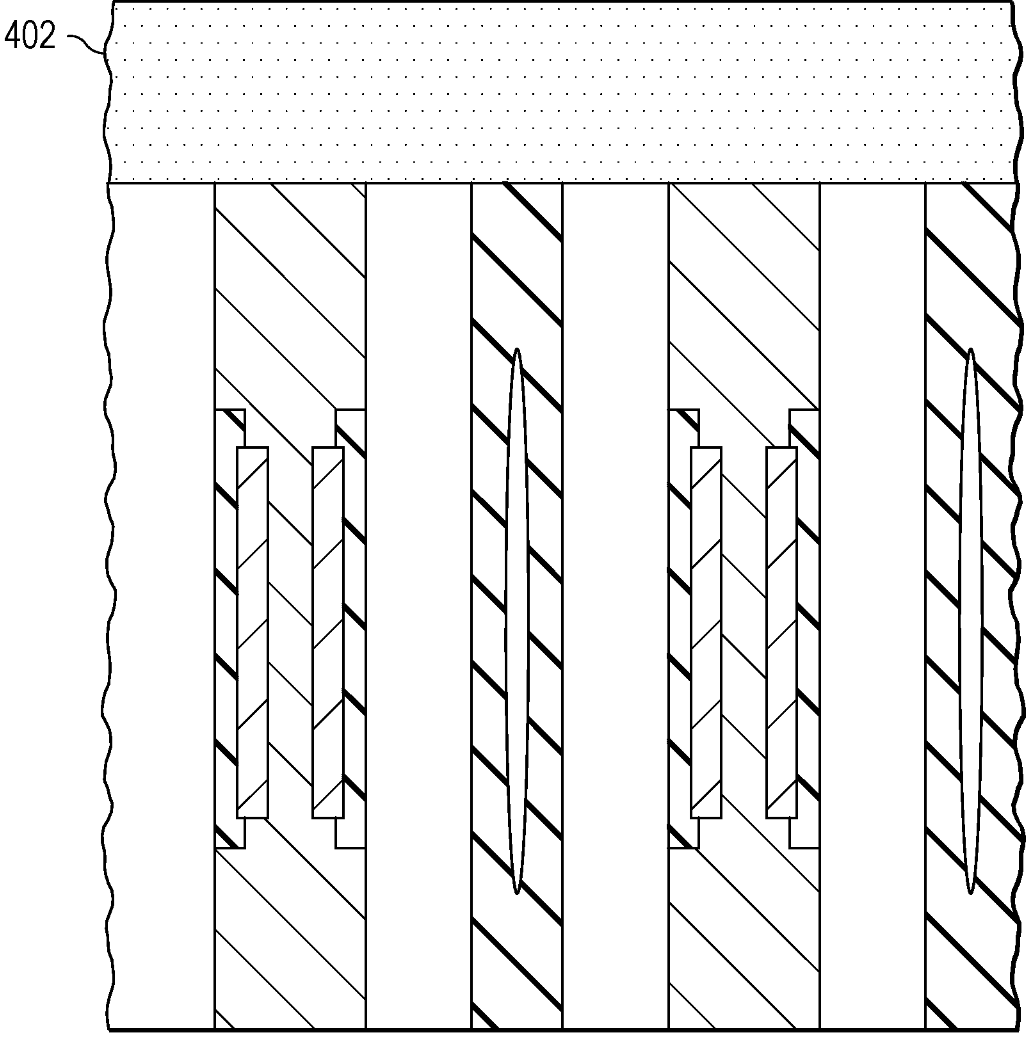
FIGS. 4A to 4H illustrate an example process of forming a connect structure between a vertical transistor and a capacitor, according to some aspects of the present disclosure.
Figure 4B:
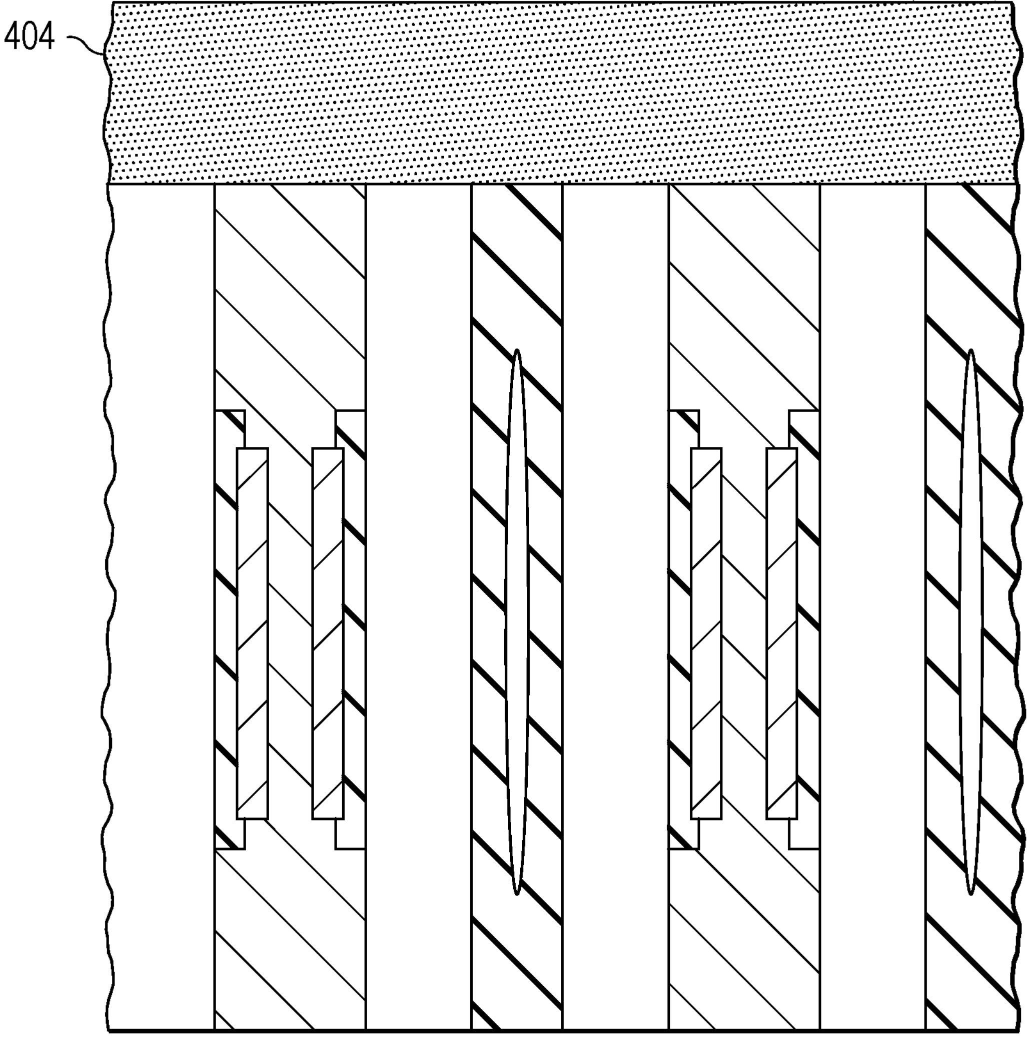
Figure 4C:
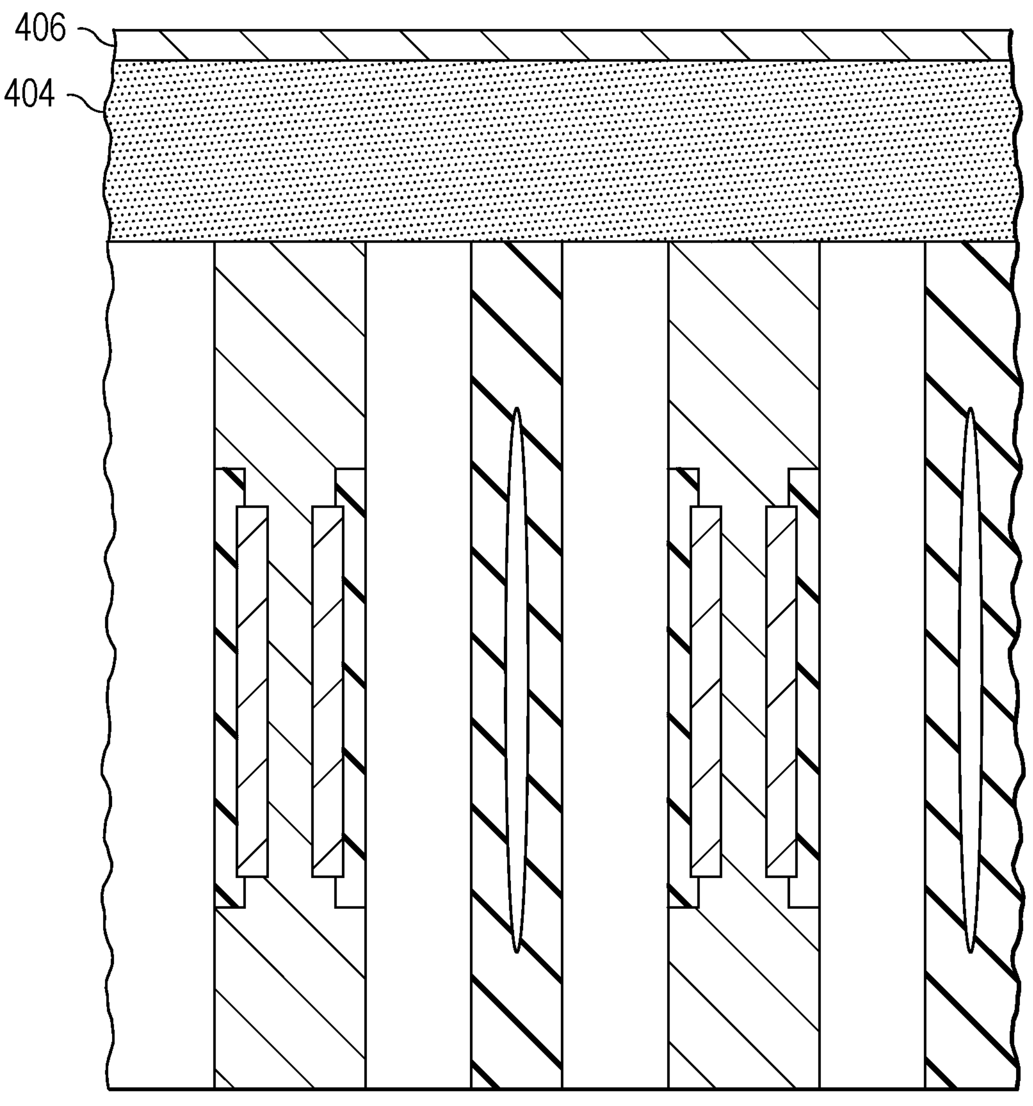
Figure 4D:
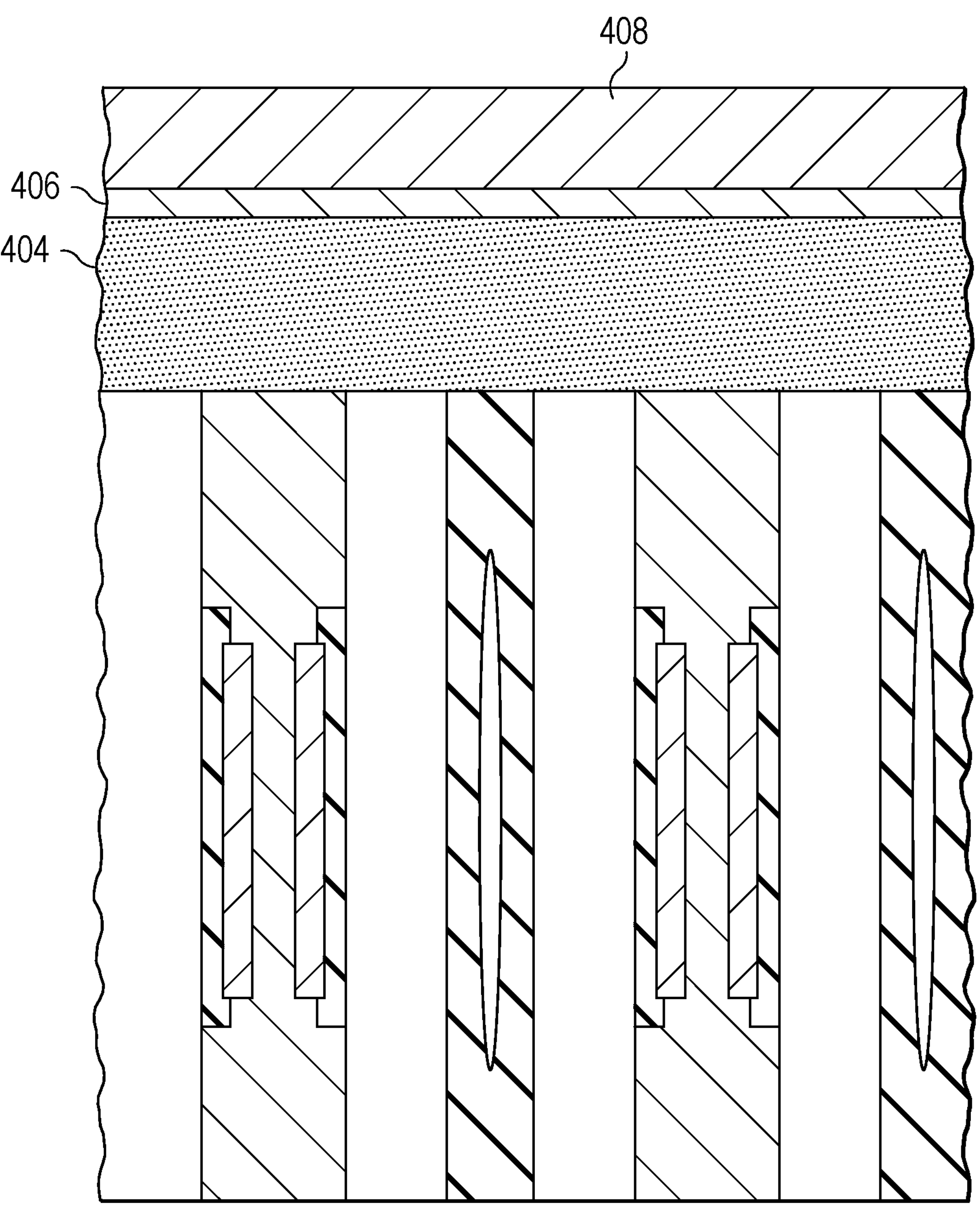
Figures 1, 4E:
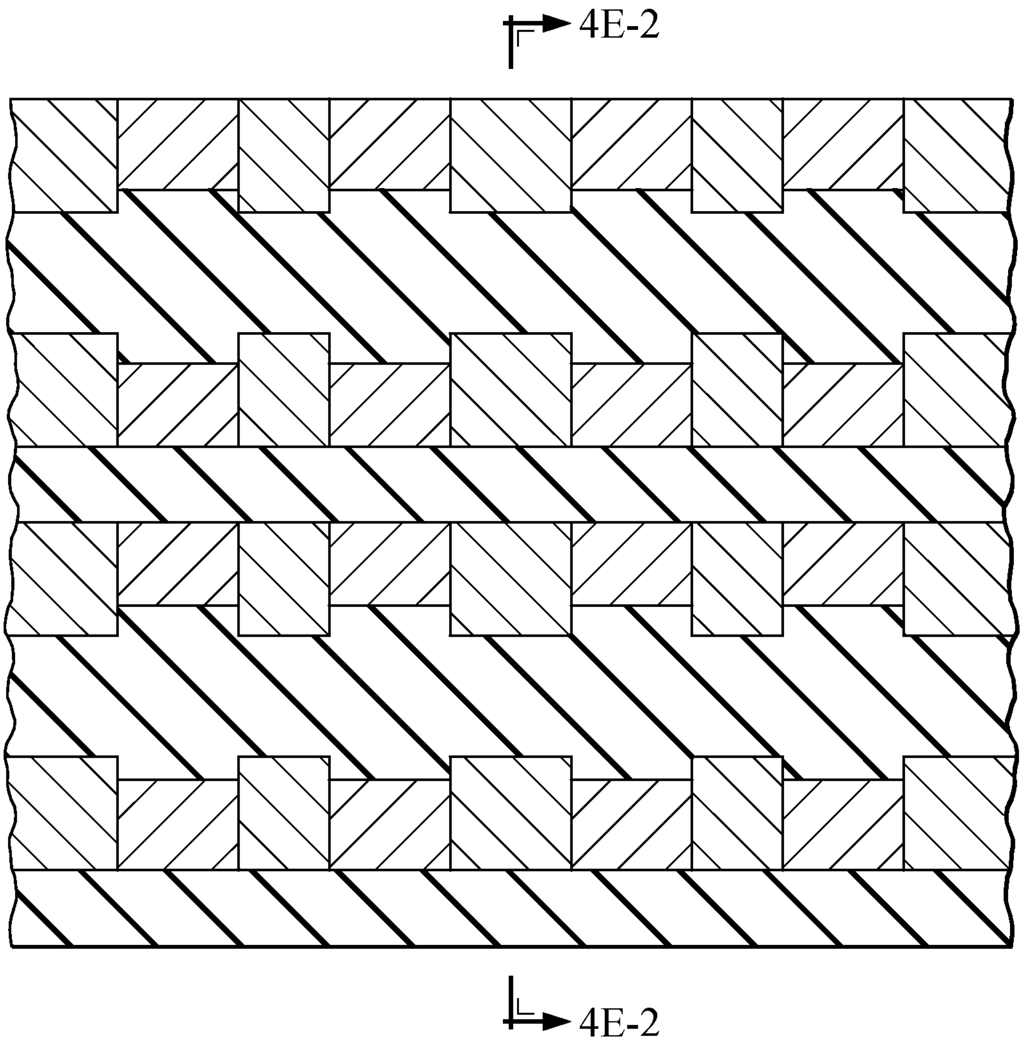
Figures 2, 4E:
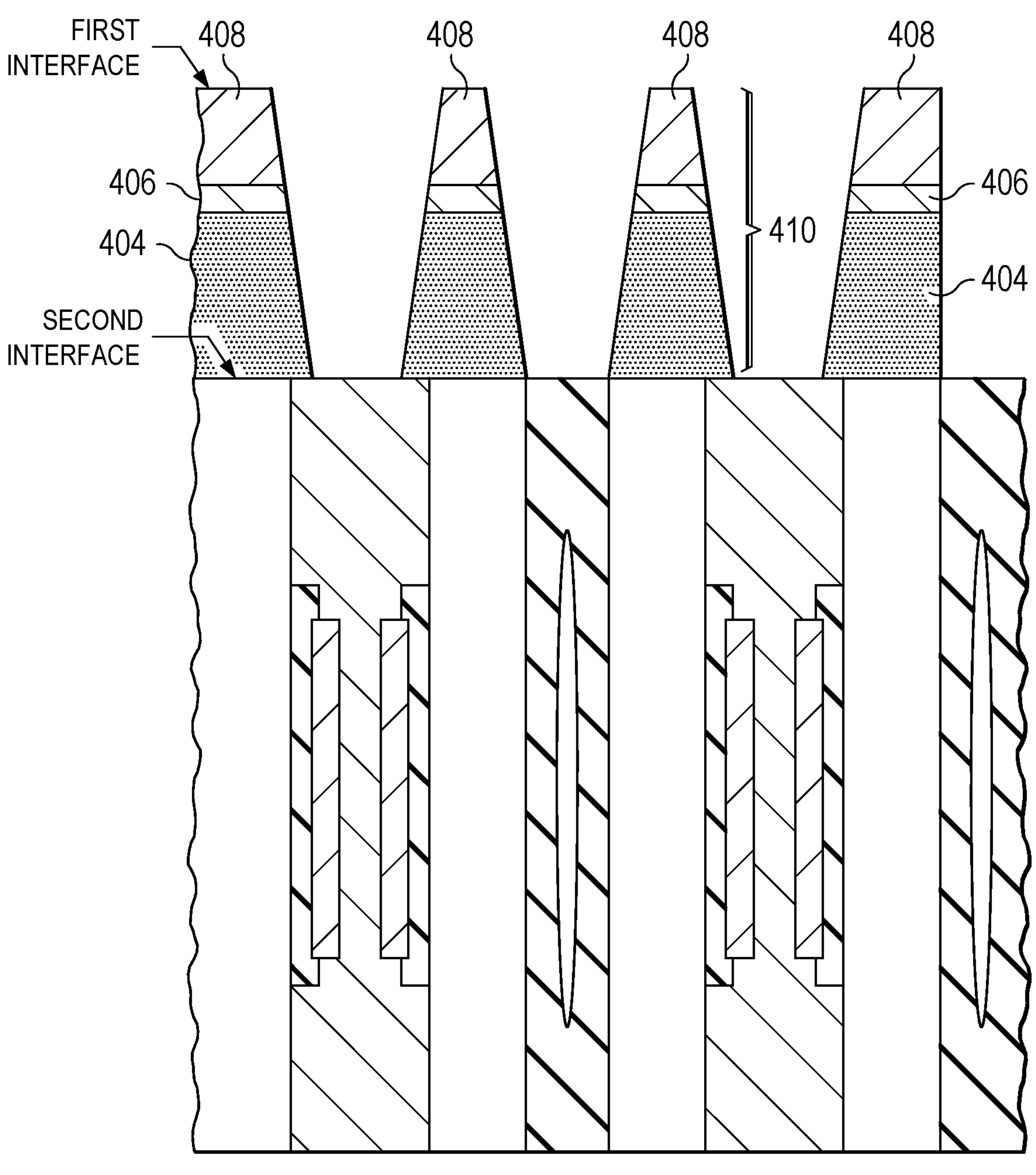
Figure 4F:
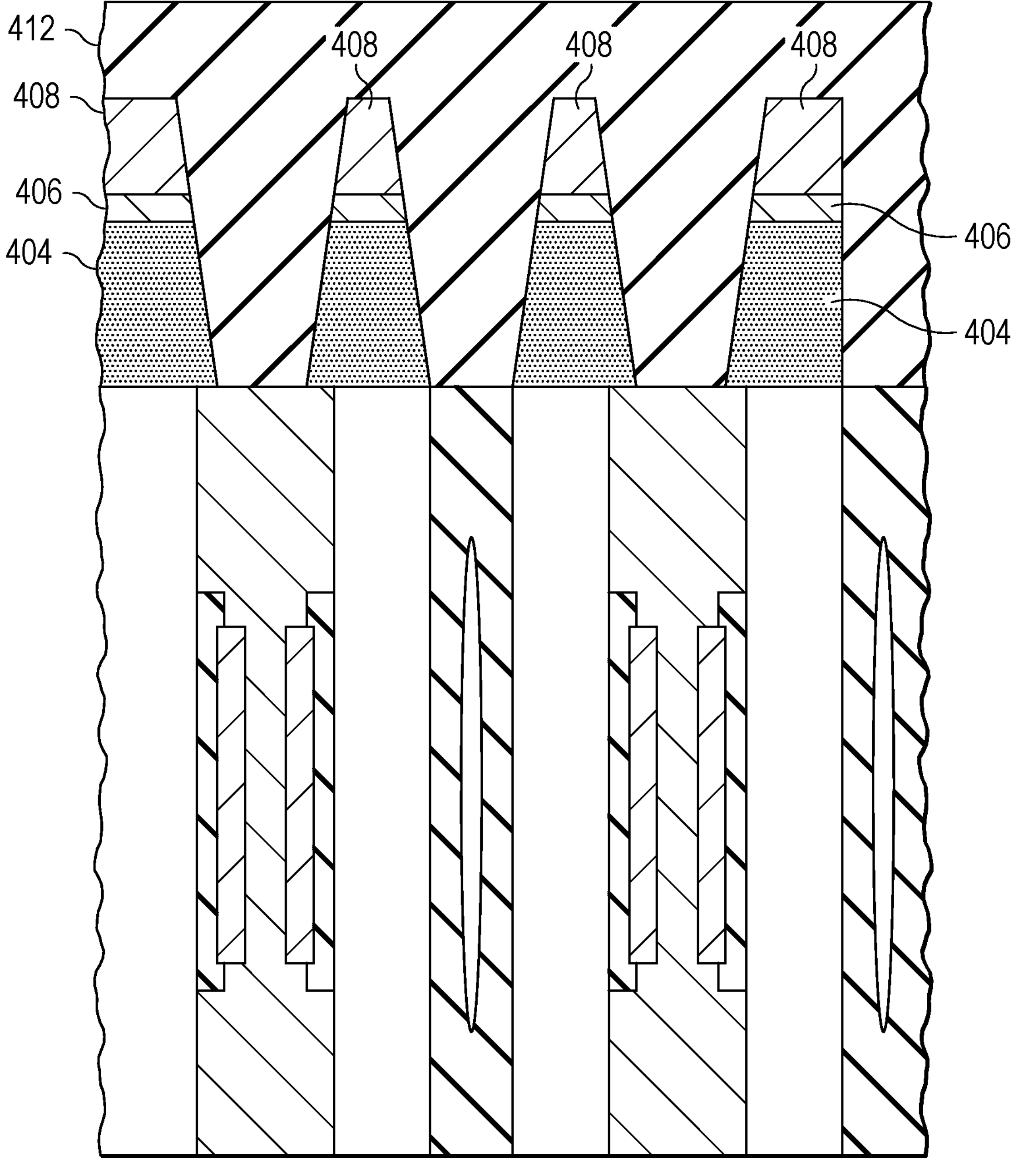
Figures 1, 4G:
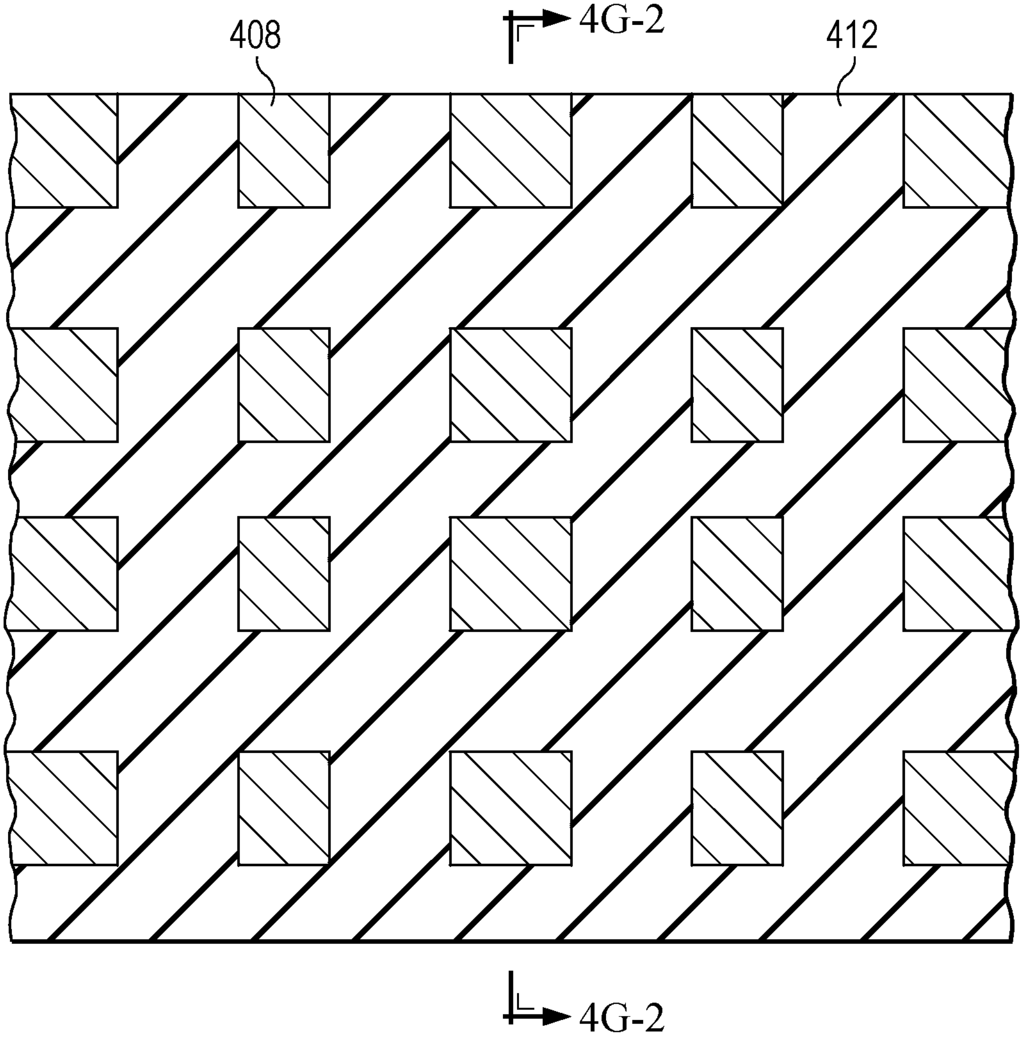
Figures 2, 4G:
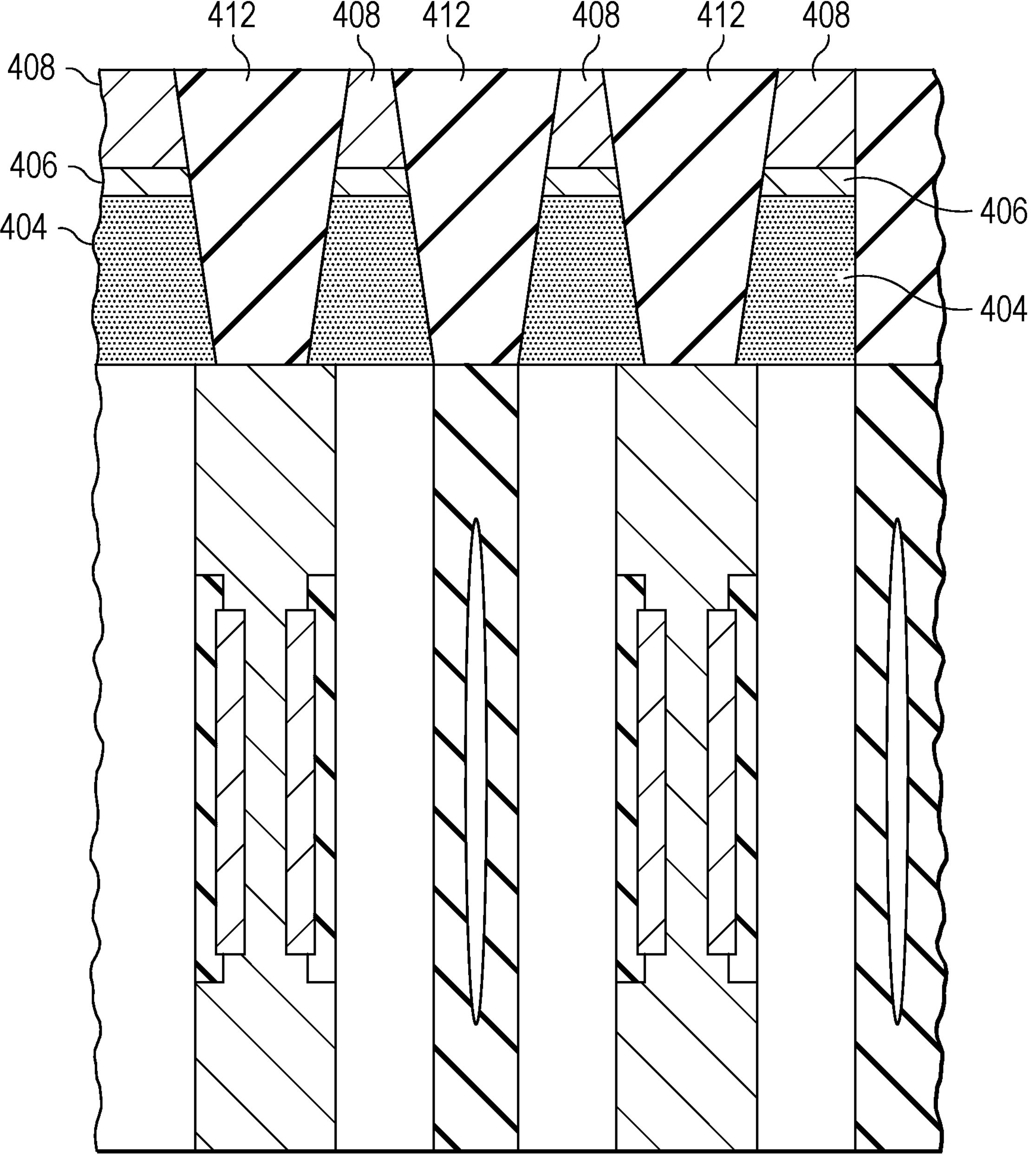
Figure 4H:
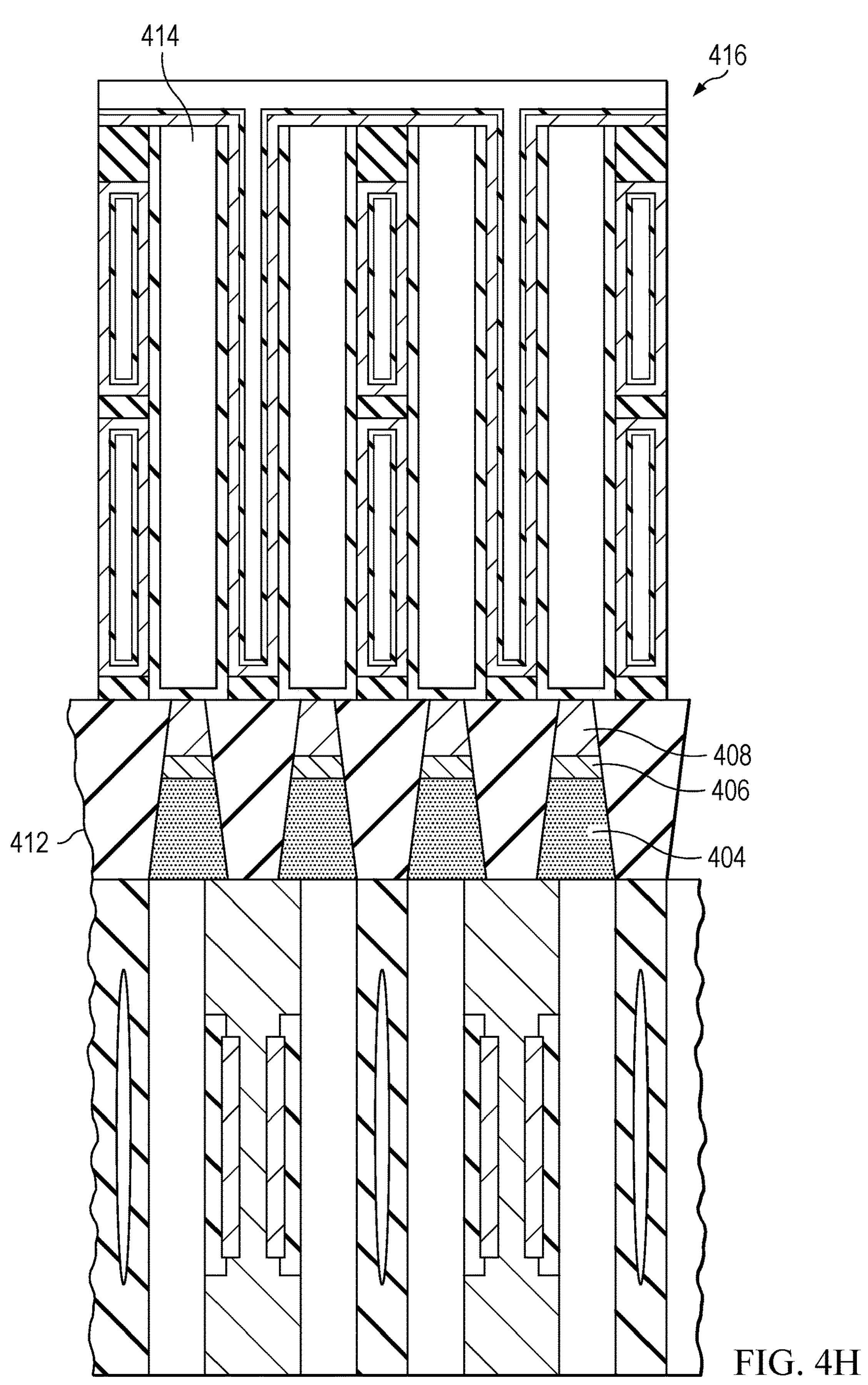

FIGS. 4A to 4H illustrate an example process of forming a connect structure between a vertical transistor and a capacitor, according to some aspects of the present disclosure. FIGS. 4A to 4D illustrate how to form a connect layer over multiple vertical transistors, and FIGS. 4E-1 to 4H illustrate how to use the connect layer to form a respective connect structure between each vertical transistor and the corresponding capacitor in a one-transistor-one-capacitor (1T1C) array 416 shown in FIG. 4H.

As shown in FIG. 4A, the example process includes depositing polysilicon layer 402 on multiple vertical transistors, either on the source end or the drain end of the multiple vertical transistors. An example of a vertical transistor in FIG. 4A is shown in FIG. 3B and includes word line 302, gate dielectric 304, and semiconductor body 306.

As shown in FIG. 4B, the example process includes an ion implantation of the deposited polysilicon layer, followed by the activation of the implanted dopants in the deposited polysilicon layer 402 to form activated polysilicon layer 404.

As shown in FIG. 4C, the example process includes the formation of silicide layer 406 over activated polysilicon layer 404.

As shown in FIG. 4D, the example process includes depositing metal layer 408 (e.g., tungsten layer) over silicide layer 406. An example material in metal layer 408 can be tungsten (W). A connect layer between the multiple vertical transistors and their corresponding capacitors can include the three layers described above (i.e., activated polysilicon layer 404, silicide layer 406, and metal layer 408) and can be used to form a respective connect structure between each vertical transistor and the corresponding capacitor in a 1T1C array 416 shown in FIG. 4H, as illustrated in FIGS. 4E-1 to 4H. In some implementations, the connect layer between the multiple vertical transistors and their corresponding capacitors can include activated polysilicon layer 404 and silicide layer 406, without metal layer 408.

FIGS. 4E-1 and 4E-2 illustrate a plan view and a side view respectively of multiple vertical transistors and connect structures 410. As shown in FIGS. 4E-1 and 4E-2, the example process includes etching through the connect layer to form connect structures 410 that can be used to connect each vertical transistor to the corresponding capacitor. As shown in FIG. 4E-2, multiple connect structures 410 are formed after the connect layer is etched through. Connect structures 410 can include multiple layers in the connect layer, for example, activated polysilicon layer 404 coupled to the multiple vertical transistors in FIG. 4E-2, silicide layer 406 formed over activated polysilicon layer 404, and metal layer 408 formed over silicide layer 406. An example material in metal layer 408 can be tungsten (W). In some implementations, a shape of a cross section of a connect structure 410 can be a trapezoid. Therefore, a size of an end (e.g., second interface) of a connect structure 410 coupled to a vertical transistor can be larger than a size of the opposite end (e.g., first interface) of the connect structure 410. The opposite end of the connect structure 410 can be connected to a capacitor.

In some implementations, the etching process can be a two-step process, where the connect layer is first etched through in a first direction, for example, the word line direction, then the connect layer is etched through in a second direction, for example, the bit line direction. The resulting pattern of the conductive surface at the top of the connect structures 410 is illustrated in the plan view of the multiple vertical transistors and connect structures 410 in FIG. 4E-1, which shows that the shape of the top conductive surface of each connect structure 410 is a rectangle.

In some implementations, the etching process can be a one-step process, where the connect layer is etched through in a single step using a mask to form the pattern of the conductive surface at the top of the connect structures 410 illustrated in the plan view of the multiple vertical transistors and connect structures 410 in FIG. 4E-1.

As shown in FIG. 4F, the example process includes forming a connect structure between a vertical transistor and a capacitor, which includes filling dielectric material 412 into the air gaps in the connect layer formed after the etching process described above. An example of dielectric material 412 is silicon nitride. Other example dielectric material 412 can include silicon oxide, silicon oxynitride, or high-k dielectrics.

FIGS. 4G-1 and 4G-2 illustrate a plan view and a side view respectively of multiple vertical transistors, connect structures 410, and dielectric material 412. As shown in FIGS. 4G-1 and 4G-2, the example process includes exposing the top conductive surface of multiple connect structures 410 by removing excess parts of the filled dielectric material 412 using a planarization process. An example of the planarization process is the chemical mechanical polishing (CMP) process. FIGS. 4G-1 and 4G-2 show the resulting structure after the planarization process. As shown in FIG. 4G-1, the shape of the top exposed conductive surface of each connect structure 410 is a rectangle.

Figure 6C:
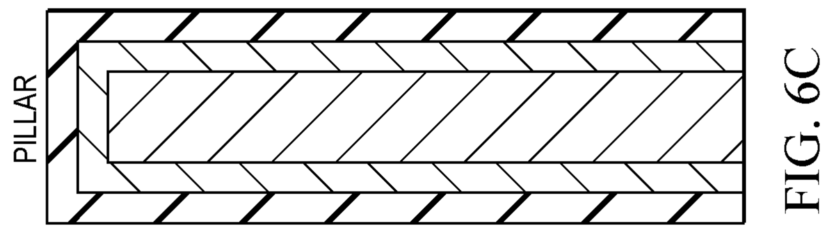
FIGS. 6A to 6C illustrate three types of capacitors, according to some aspects of the present disclosure.
Figure 6B:
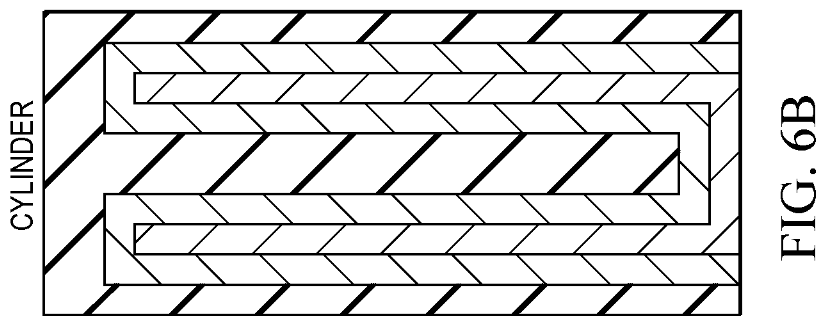
Figure 6A:
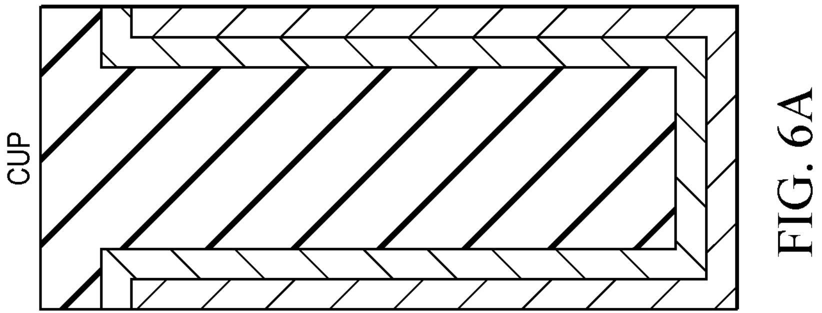

As shown in FIG. 4H, the example process includes forming a respective capacitor 414 over each connect structure 410 that connects each capacitor 414 and the corresponding vertical transistor. A 1T1C array 416 that includes multiple connect structures 410 connecting capacitors 414 and the corresponding vertical transistors can thus be formed. Example types of capacitors are shown in FIGS. 6A, 6B, and 6C. FIG. 6A illustrates a cup type capacitor, FIG. 6B illustrates a cylinder type capacitor, and FIG. 6C illustrates a pillar type capacitor, according to some aspects of the present disclosure.

Figure 5:
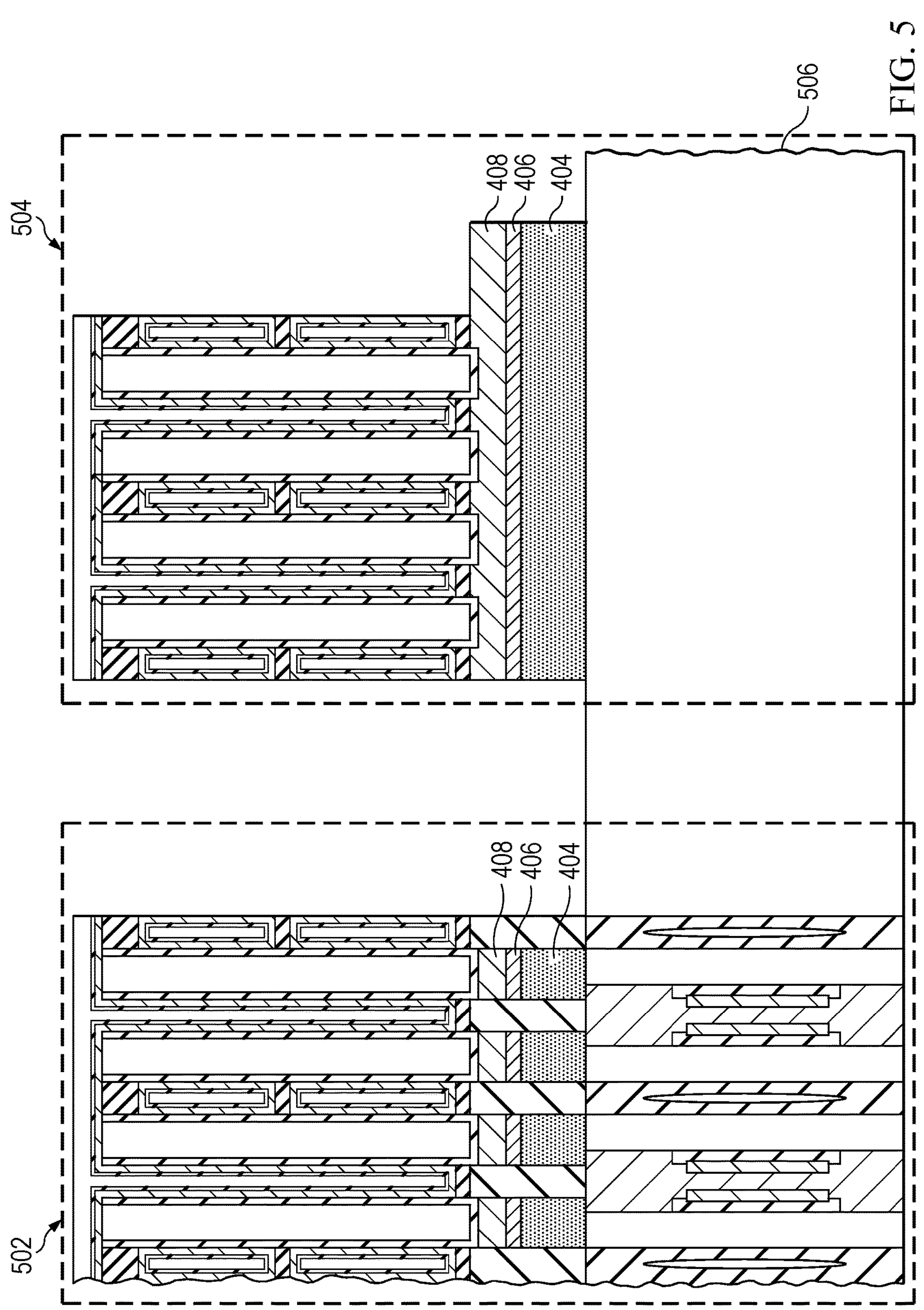
FIG. 5 illustrates an example structure that includes a one-transistor-one-capacitor (1T1C) array and a cell cap area, according to some aspects of the present disclosure.

FIG. 5 illustrates an example structure that includes a 1T1C array 502 and a cell cap area 504, according to some aspects of the present disclosure. The cell cap area 504 includes multiple capacitors that are connected to a common connect layer that is deposited over substrate 506. In some implementations, the common connect layer can include activated polysilicon layer 404, silicide layer 406, and metal layer 408. Therefore, the layered structure of the common connect layer enables all the capacitors in cell cap area 504 to be connected at their bottom plates to metal layer 408.

Figure 7A:
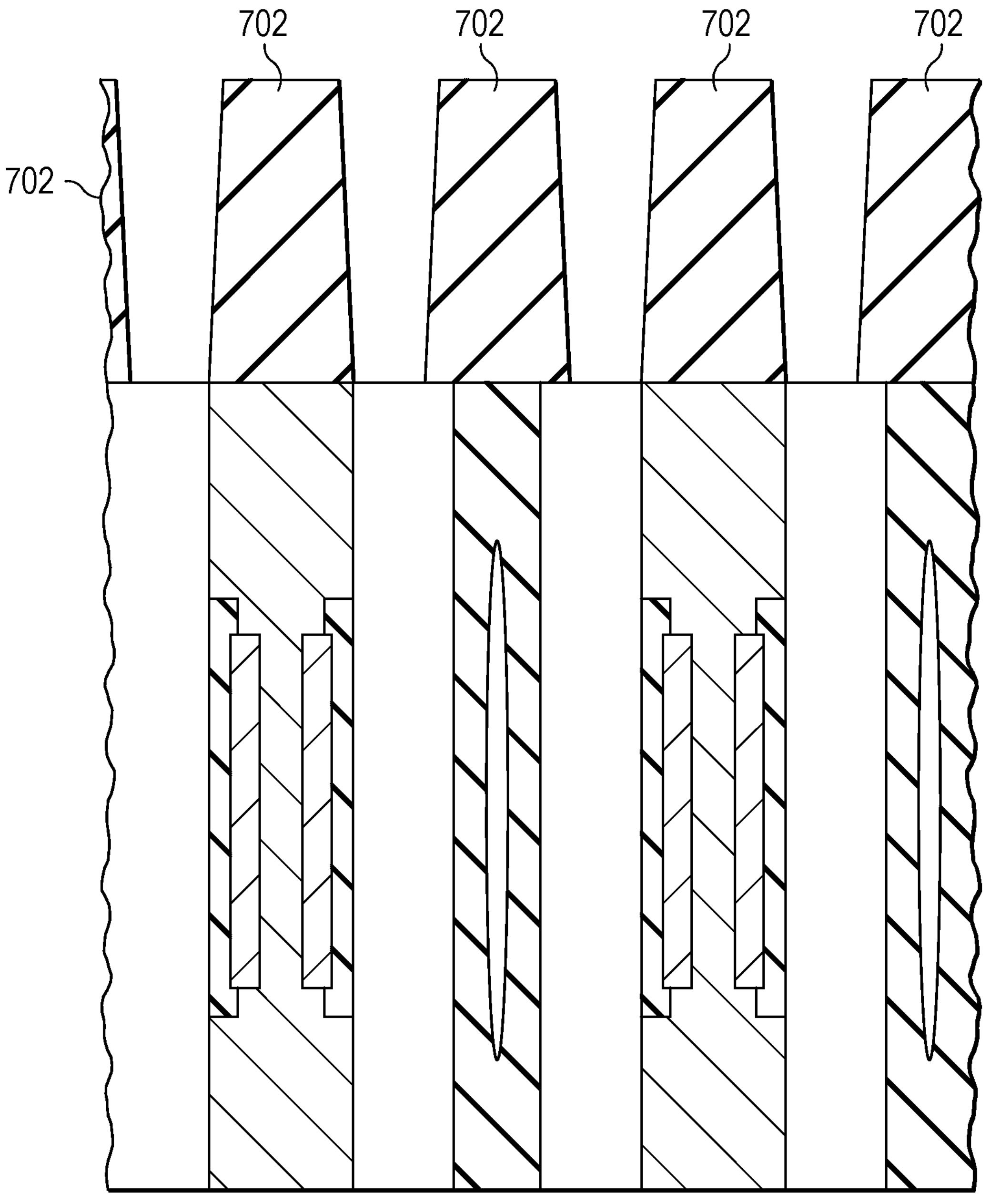
FIGS. 7A to 7E illustrate another example process of forming a connect structure between a vertical transistor and a capacitor, according to some aspects of the present disclosure.

FIGS. 7A to 7E illustrate another example process of forming a connect structure 712 between a vertical transistor and a capacitor, according to some aspects of the present disclosure. As shown in FIG. 7A, the example process includes etching through a dielectric layer 702 that is deposited over multiple vertical transistors to form a respective hole over a source end of a drain end of each vertical transistor. In some implementations, the top surface of each hole has a circular shape.

Figure 7B:
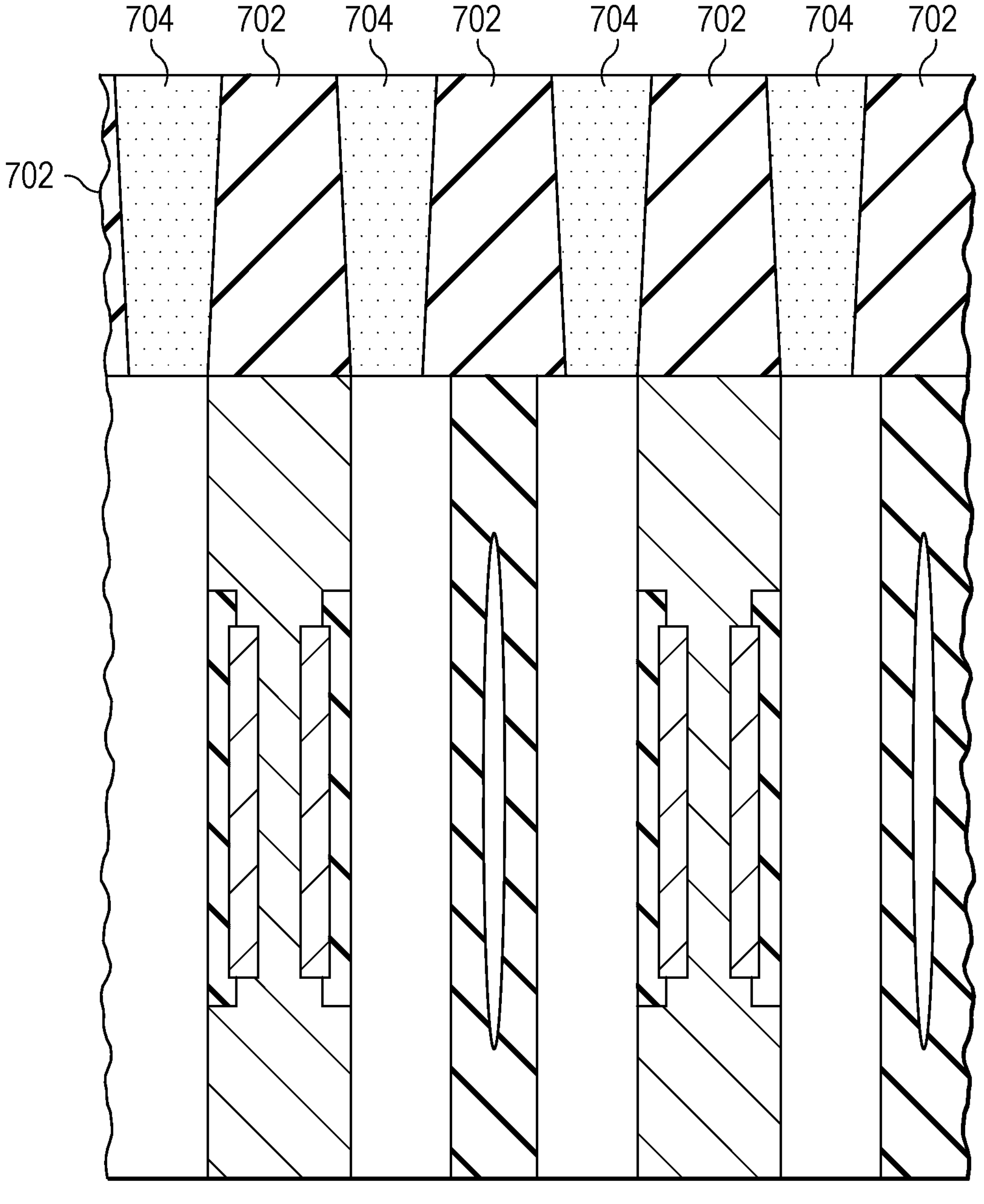

As shown in FIG. 7B, the example process includes filling polysilicon 704 into the holes formed earlier. A planarization process, such as a CMP process, can then be used to remove excess parts of the filled polysilicon 704.

Figure 7C:
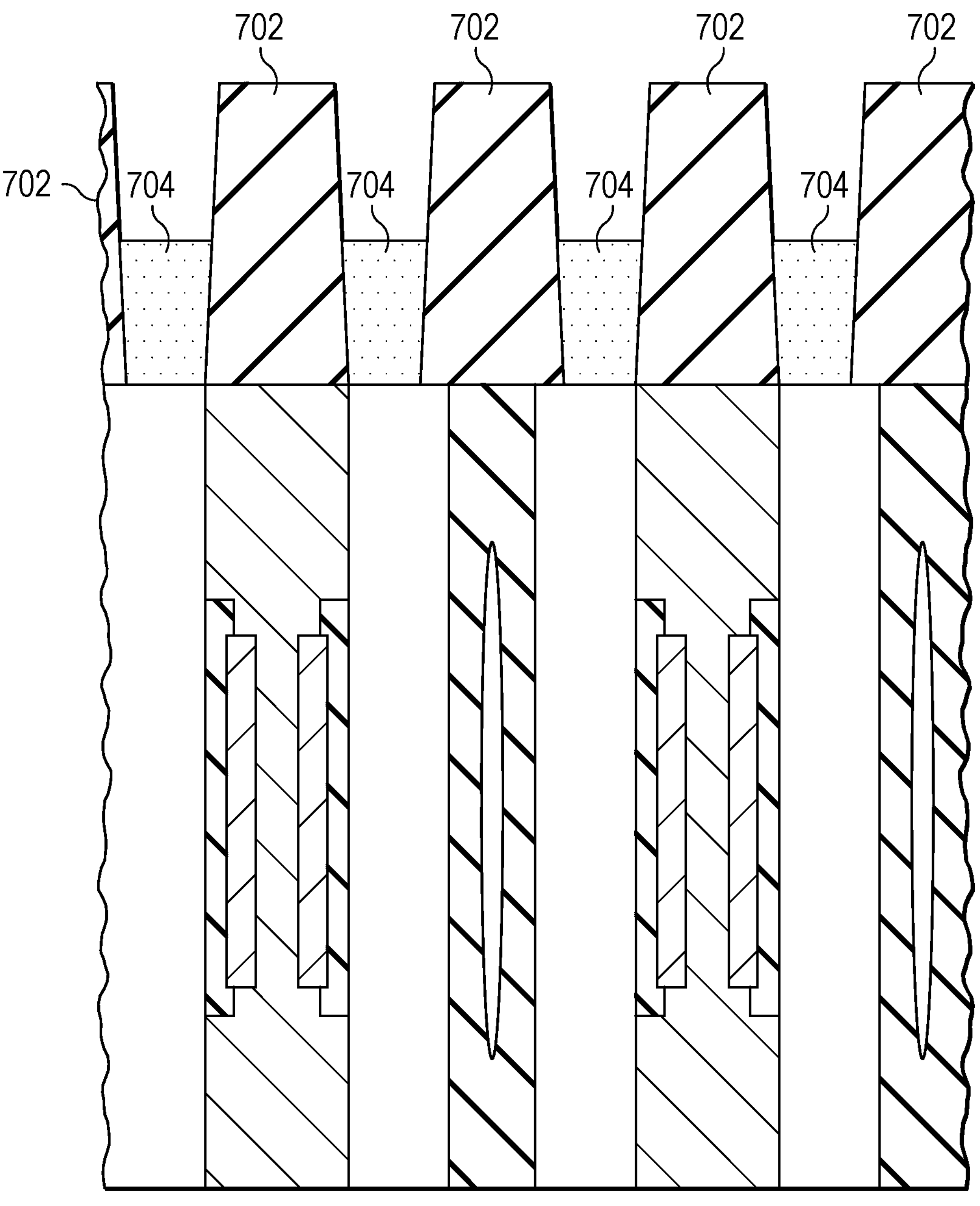

As shown in FIG. 7C, the example process includes etching a portion of the filled polysilicon 704 in each hole to make space for additional layers of the connect structure to be deposited later.

Figure 7D:
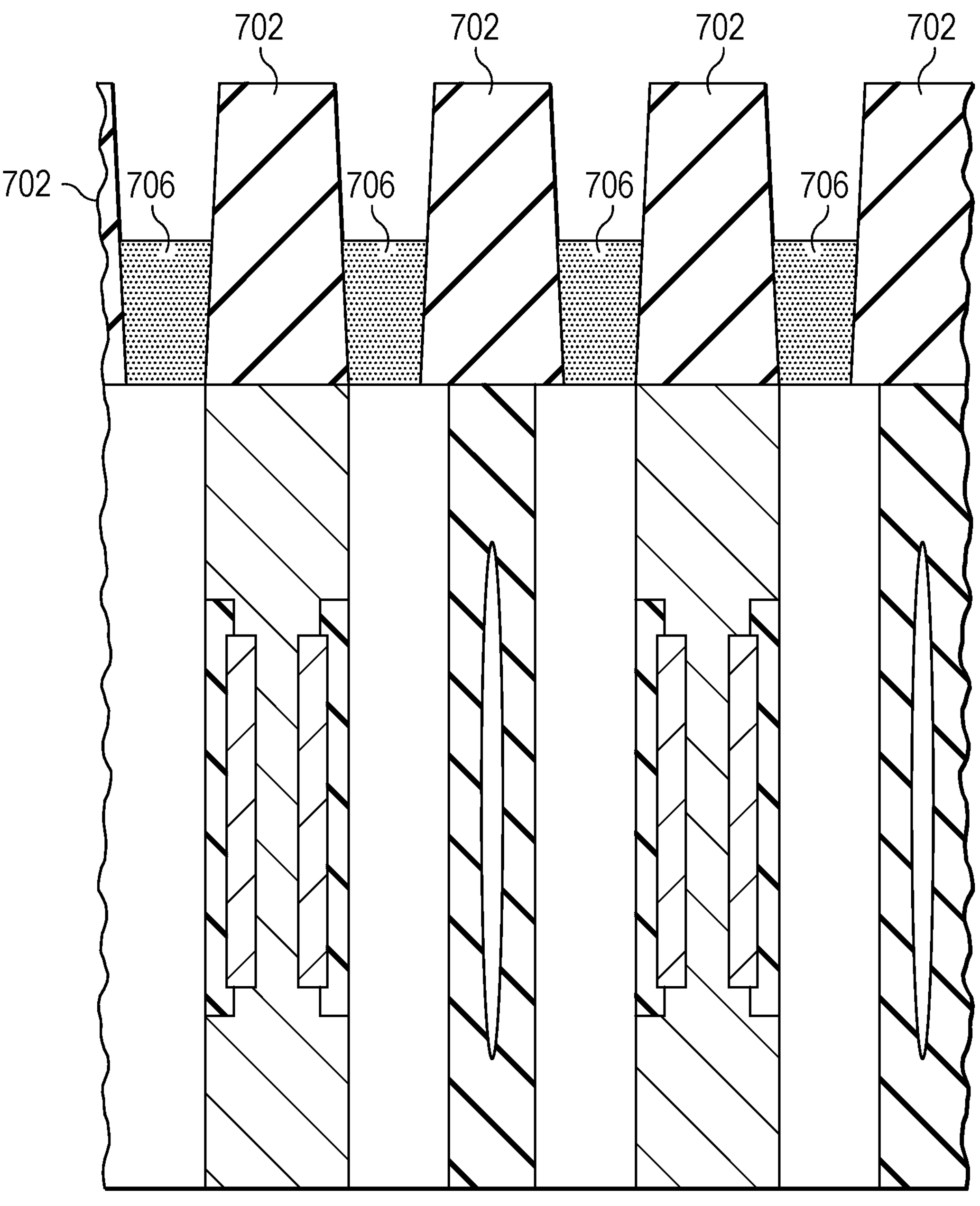

As shown in FIG. 7D, the example process includes performing an ion implantation process to the remaining polysilicon in each hole and activating the implanted dopants in the remaining polysilicon to form activated polysilicon 706 in each hole.

Figure 7E:
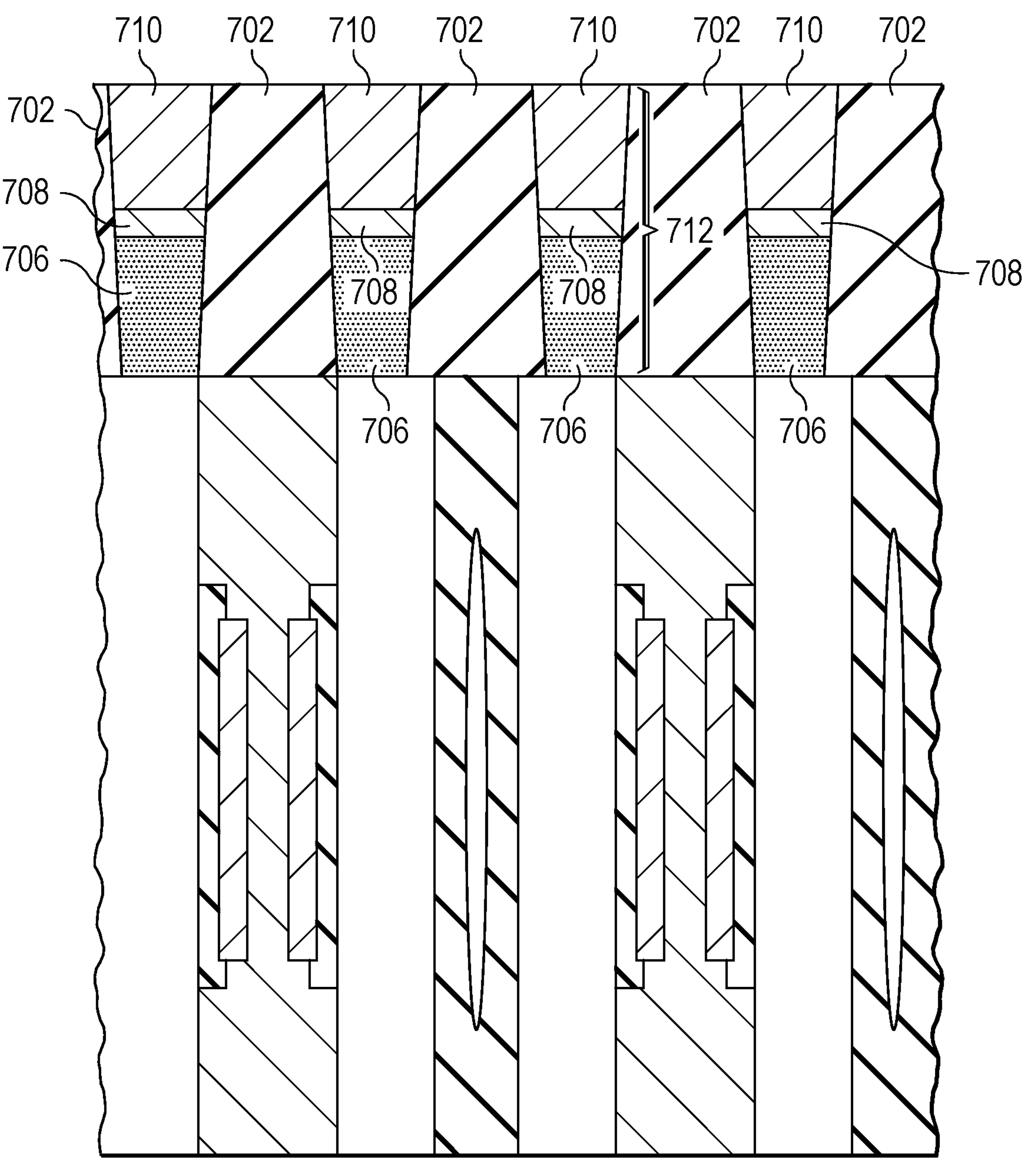

As shown in FIG. 7E, the example process includes depositing silicide material 708 and metal material 710 over activated polysilicon 706 in each hole to form a respective connect structure 712 in each hole. An example of metal material 710 can be tungsten (W). Because a cross-section of each hole can have a shape of an inverted trapezoid, the connect structure in each hole can also have a shape of inverted trapezoid. Therefore, a size of an end of a connect structure 712 coupled to a vertical transistor can be smaller than a size of the opposite end of the connect structure 712. The opposite end of the connect structure 712 can be connected to a capacitor.

Figure 8:
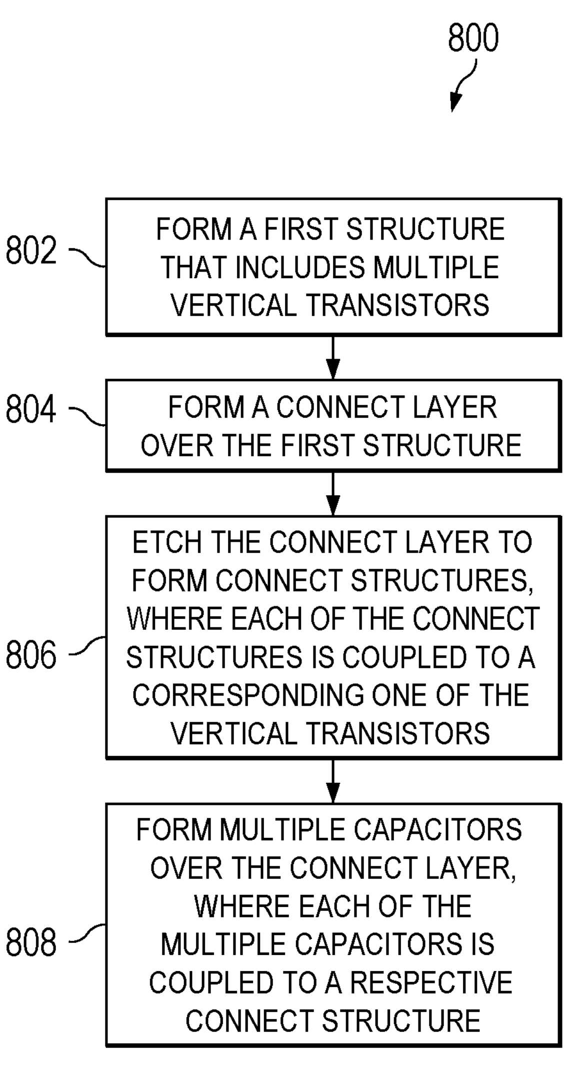
FIG. 8 illustrates an example of a flow chart of a method for forming connect structures that connect vertical transistors and capacitors, according to some aspects of the present disclosure.

FIG. 8 illustrates an example 800 of a flow chart of a method for forming connect structures that connect vertical transistors and capacitors, according to some aspects of the present disclosure. At 802, a first structure that includes multiple vertical transistors is formed. At 804, a connect layer over the first structure is formed. At 806, the connect layer is etched to form connect structures, where each of the connect structures is coupled to a corresponding one of the vertical transistors. At 808, multiple capacitors are formed over the connect layer, where each of the multiple capacitors is coupled to a respective connect structure.

Certain aspects of the subject matter described here can be implemented as a three-dimensional (3D) memory device. The 3D memory device includes a vertical transistor, a capacitor, and a connect structure, where the capacitor is coupled to the vertical transistor through the connect structure, the connect structure includes a first interface and a second interface, the first interface is coupled to the capacitor, the second interface is coupled to the vertical transistor, and a size of the first interface is smaller than a size of the second interface.

The 3D memory device can include one or more of the following features.

In some implementations, a shape of a cross-section of the connect structure along a first direction is a rectangle.

In some implementations, the vertical transistor includes a semiconductor body and a gate structure, the semiconductor body extends in a same direction as the vertical transistor, and the gate structure is in contact with one or more sides of the semiconductor body.

In some implementations, two ends of the semiconductor body extend beyond the gate structure, respectively.

In some implementations, the vertical transistor is a gate-all-around (GAA) transistor in which the gate structure fully circumscribes the semiconductor body in a plan view.

In some implementations, a bit line and the capacitor are coupled to opposite ends of the vertical transistor.

In some implementations, a shape of a cross-section of the connect structure along a second direction is a trapezoid.

In some implementations, a dielectric medium is filled between neighboring connect structures in the 3D memory device.

In some implementations, the connect structure includes a tungsten layer.

Certain aspects of the subject matter described here can be implemented as a method. The method includes forming a first structure that includes multiple vertical transistors. A connect layer is formed over the first structure. The connect layer is etched to form connect structures, where each of the connect structures is coupled to a corresponding one of the vertical transistors. Multiple capacitors are formed over the connect layer, where each of the plurality of capacitors is coupled to a respective connect structure.

The method can include one or more of the following features.

In some implementations, etching the connect layer includes etching multiple holes through the connect layer and filling the multiple holes with a dielectric medium.

In some implementations, etching the connect layer to form the connect structures includes etching through the connect layer along a first direction and etching through the connect layer along a second direction to form the connect structures, where the first direction is perpendicular to the second direction.

In some implementations, the connect layer includes a polysilicon layer, a silicide layer, and a tungsten layer.

In some implementations, the method further includes forming a bit line coupled to one or more of the multiple vertical transistors.

In some implementations, forming the connect layer over the first structure includes forming a polysilicon layer over the first structure and forming a silicide layer over the polysilicon layer, where the connect layer comprises the polysilicon layer and the silicide layer.

Certain aspects of the subject matter described here can be implemented as a memory system. The memory system includes a 3D memory device and a controller coupled to the 3D memory device and configured to initiate operations of the 3D memory device. The 3D memory device includes a vertical transistor, a capacitor, and a connect structure, where the capacitor is coupled to the vertical transistor through the connect structure, the connect structure includes a first interface and a second interface, the first interface is coupled to the capacitor, the second interface is coupled to the vertical transistor, and a size of the first interface is smaller than a size of the second interface.

The memory system can include one or more of the following features.

In some implementations, a shape of a cross-section of the connect structure along a first direction is a rectangle.

In some implementations, the vertical transistor comprises a semiconductor body and a gate structure, the semiconductor body extends in a same direction as the vertical transistor, and the gate structure is in contact with one or more sides of the semiconductor body.

In some implementations, a shape of a cross-section of the connect structure along a second direction is a trapezoid.

In some implementations, a bit line and the capacitor are coupled to opposite ends of the vertical transistor.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A three-dimensional (3D) memory device, comprising:

a vertical transistor, a capacitor, and a connect structure, wherein the capacitor is coupled to the vertical transistor through the connect structure, the connect structure comprises a first interface and a second interface, the first interface is coupled to the capacitor, the second interface is coupled to the vertical transistor, and a size of the first interface is smaller than a size of the second interface.

2. The 3D memory device of claim 1, wherein a shape of a cross-section of the connect structure along a first direction is a rectangle.

3. The 3D memory device of claim 1, wherein the vertical transistor comprises a semiconductor body and a gate structure, the semiconductor body extends in a same direction as the vertical transistor, and the gate structure is in contact with one or more sides of the semiconductor body.

4. The 3D memory device of claim 3, wherein two ends of the semiconductor body extend beyond the gate structure, respectively.

5. The 3D memory device of claim 3, wherein the vertical transistor is a gate-all-around (GAA) transistor in which the gate structure fully circumscribes the semiconductor body in a plan view.

6. The 3D memory device of claim 1, wherein a bit line and the capacitor are coupled to opposite ends of the vertical transistor.

7. The 3D memory device of claim 1, wherein a shape of a cross-section of the connect structure along a second direction is a trapezoid.

8. The 3D memory device of claim 1, wherein a dielectric medium is filled between neighboring connect structures in the 3D memory device.

9. The 3D memory device of claim 1, wherein the connect structure comprises a tungsten layer.

10. A method, comprising:

forming a first structure comprising a plurality of vertical transistors;

forming a connect layer over the first structure;

etching the connect layer to form connect structures, wherein each of the connect structures is coupled to a corresponding one of the vertical transistors; and forming a plurality of capacitors over the connect layer, wherein each of the plurality of capacitors is coupled to a respective connect structure.

11. The method of claim 10, wherein etching the connect layer comprises:

etching a plurality of holes through the connect layer; and filling the plurality of holes with a dielectric medium.

12. The method of claim 10, wherein etching the connect layer to form the connect structures comprises:

etching through the connect layer along a first direction; and etching through the connect layer along a second direction to form the connect structures, wherein the first direction is perpendicular to the second direction.

13. The method of claim 10, wherein the connect layer comprises a polysilicon layer, a silicide layer, and a tungsten layer.

14. The method of claim 10, wherein the method further comprises forming a bit line coupled to one or more of the plurality of vertical transistors.

15. The method of claim 10, wherein forming the connect layer over the first structure comprises:

forming a polysilicon layer over the first structure; and forming a silicide layer over the polysilicon layer, wherein the connect layer comprises the polysilicon layer and the silicide layer.

16. A memory system, comprising:

a three-dimensional (3D) memory device, comprising:

a vertical transistor, a capacitor, and a connect structure, wherein the capacitor is coupled to the vertical transistor through the connect structure, the connect structure comprises a first interface and a second interface, the first interface is coupled to the capacitor, the second interface is coupled to the vertical transistor, and a size of the first interface is smaller than a size of the second interface; and a memory controller coupled to the 3D memory device and configured to initiate operations of the 3D memory device.

17. The memory system of claim 16, wherein a shape of a cross-section of the connect structure along a first direction is a rectangle.

18. The memory system of claim 16, wherein the vertical transistor comprises a semiconductor body and a gate structure, the semiconductor body extends in a same direction as the vertical transistor, and the gate structure is in contact with one or more sides of the semiconductor body.

19. The memory system of claim 16, wherein a shape of a cross-section of the connect structure along a second direction is a trapezoid.

20. The memory system of claim 16, wherein a bit line and the capacitor are coupled to opposite ends of the vertical transistor.

* * * * *